(12) United States Patent
Miteva et al.

(10) Patent No.: US 7,683,363 B2
(45) Date of Patent: Mar. 23, 2010

(54) COMPOSITION FOR PHOTON-ENERGY UP-CONVERSION

(75) Inventors: Tzenka Miteva, Stuttgart (DE); Gabriele Nelles, Stuttgart (DE); Akio Yasuda, Esslingen (DE); Stanislav Balouchev, Mainz (DE); John Lupton, Neuried (DE); Panagiotis Keivanidis, Mainz (DE)

(73) Assignees: Sony Deutschland GmbH, Cologne (DE); Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 1567 days.

(21) Appl. No.: 10/856,628

(22) Filed: May 28, 2004

(65) Prior Publication Data

US 2005/0056815 A1    Mar. 17, 2005

(30) Foreign Application Priority Data

Jun. 2, 2003   (EP)  ................................. 03012536

(51) Int. Cl.
*H01L 31/00*   (2006.01)
*C07B 47/00*   (2006.01)
(52) U.S. Cl. ........................... 257/21; 540/145
(58) Field of Classification Search ............ 257/21; 540/145
See application file for complete search history.

(56) References Cited

U.S. PATENT DOCUMENTS

| 5,912,257 A | 6/1999 | Prasad et al. |
| 6,372,154 B1 | 4/2002 | Li |

FOREIGN PATENT DOCUMENTS

| WO | WO 02 15645 | 2/2002 |
| WO | WO 02 101847 | 12/2002 |

OTHER PUBLICATIONS

U.S. Appl. No. 12/099,639, filed Apr. 8, 2008, Miteva, et al.
Cleave V et al: "Transfer Processes in Semiconducting Polymer-Porphyrin Blends" Advanced Materials, VCH Verlagsgesellschaft, Weinheim, DE, vol. 13, No. 1, Jan. 5, 2001, pp. 44-47, XP001001053 ISSN: 0935-9648.
O'Brien D F et al: "Improved Energy Transfer in Electrophosphorescent Devices" Applied Physics Letters, American Institute of Physics, New York, US, vol. 74, No. 3, Jan. 18, 1999, pp. 442-444, XP000805586 ISSN: 0003-6951.
Baldo M A et al: "Highly Efficient Phosphorescent Emission From Organic Electroluminescent Devices" Nature, MacMillan Journals Ltd. London, GB, vol. 395, No. 6698, Sep. 10, 1998, pp. 151-154, XP001002103 ISSN: 0028-0836.

*Primary Examiner*—James O. Wilson
*Assistant Examiner*—Paul V. Ward
(74) *Attorney, Agent, or Firm*—Oblon, Spivak, McClelland, Maier & Neustadt, L.L.P.

(57) ABSTRACT

The present invention relates to a composition for photon energy up-conversion, a system comprising said composition and to uses of said composition and said system.

15 Claims, 15 Drawing Sheets a) Polyfluorene.

Polymers with the following side-chain-patterns, R, were used as follows:

or b) metaloporphyrines
General structure:

c) Phtalocyanine (Pc):

COMPOSITION FOR PHOTON-ENERGY UP-CONVERSION

BACKGROUND OF THE INVENTION

1. Field of Invention

The present invention relates to a composition for photon energy up-conversion, a system comprising said composition and to uses of said composition and said system.

2. Discussion of the Background

In a number of systems, it has been observed that irradiation by light with longer wavelength causes emission of a light with shorter wavelength. This phenomenon, which is also related to as "frequency up-conversion" or shortly "up-conversion" is most often associated with high light intensities available from pulsed lasers. It is presently believed that the up-conversion process involves the energy transfer of several lower excited states to a single higher excited state which is then capable of emitting light with a shorter wavelength, i.e. higher energy. This process has been described for a number of inorganic systems in the solid state, including crystals, thin films and nanoparticles. Usually the up-conversion process in the crystalline systems includes "sensitising" components, "activator" components and/or matrix (crystal) components. Typically the matrix is co-doped with rare earth ions, which act as "sensitisers" as well as "activators". One of the dopands absorbs in the low-wavelength region (typically infrared) whereupon the absorbed photon energies are then transferred to another dopand, the activator ions, which emit in the blue or green region (E. L. Falcao-Filho et al. J. Appl. Phys 92, 3065, (2002), Yoh Mita et al. Appl. Phys. Lett. 62, 802 (1992), Trash et al. Journal of OSA Bulletin 11, 881 (1994)). Furthermore crystalline nanoparticles have been described, a combination of which is dispersed in host matrices to form thin films. These crystalline nanoparticles also have been shown to be capable of energy up-conversion, which process takes place between the various species of nanoparticles and include an energy transfer step (e.g. U.S. Pat. No. 6,541,788) or the crystalline nanoparticles act as a matrix for other dopands such as $Eu^{3+}$-ions, $Tb^{3+}$ions, $Tb^{3+}$-ions, $Ce^{3+}$-ions etc., and these dopands upon irradiation of light are capable of increasing the fluorescence intensity and quantum efficiency of the nanoparticles.

These systems are of potential interest for the fabrication of lasing materials, photovoltaic devices and so on. Due to the nature of the components involved they are, however, rather expensive in manufacture and furthermore not particularly suited for the preparation of for example, films over large areas or the preparation on flexible substrates, both of which should be particularly useful for the fabrication of commercially useful photovoltaic devices, such as solar cells.

One approach to address this problem was to use organic compounds, instead of inorganic ones. These organic up-conversion systems are all based on direct two-photon or multiphoton excitation and/or the excitation of molecules populating high vibrational states into a first excited state, which latter process is also sometimes referred to as "hot band-absorption". In the direct, i.e. simultanous two-photo excitation the up-conversion is a result of a direct two-photon pumping of dyes with large two-photon absorption (TPA) cross-section, which dyes are either in solution or in films (including so called "solid" solutions, with inert polymers as an inactive matrix, i.e. a solid "solvent"). This inactive matrix is inactive in the sense that it does not take part in the up-conversion process whatsoever. Various systems have been described, and there is an ongoing search for new organic dyes with greater TPA-cross-section and TPA-dyes which are bound to polymer molecules or doped in polymer matrices (U.S. Pat. No. 5,912,257, U.S. Pat. No. 6,555,682, U.S. Pat. No. 6,100,405, T. Kojei et al. Chem. Phys. Lett. 298, 1 (1998), G. S. He et al., Appl. Phys. Lett 68, 3549 (1996) R. Schroeder et al., J. Phys.:Condens.Matter 13, L313 (2001); R. Schroder et al., J. Chem. Phys. 116, 3449(2001)). Where TPA-dyes are doped in polymer matrices, again, the polymers are inactive compounds which do not take part in the up-conversion process.

Where the up-conversion is attributed to hot-band absorption, i.e. the excitation of molecules which populate high vibrational states, this has, in some cases been used for laser cooling of matter (J. L. Clark et al.Phys Rev. Lett 76, 2037 (1996)) and/or as a temperature probe of opto-electronic devices (J. M. Lupton, Appl. Phys. Lett 80, 186 (2002)).

Another area of research in the field of organic compounds is the field of "optical limiters". An optical limiting material shows non-linear absorption characteristics. This is due to the phenomenon that the cross-section of the excited state is large than that of the ground state. The larger the input energy the more molecules become excited into the state having a larger cross-section, thus resulting in an increasing absorption coefficient. Optical limiters based upon this nonlinear absorption on the picosecond and nanosecond time-scales have been reported for a number of materials, including metallophthalocyanins, porphyrins and fullerenes but also inorganic nanoparticles (Qureshi F M et al. Chem. Phys. 231, 87 (1998) and other references cited therein; Sun et al. Int. Rev. Phys. Chem. 18(1) 43 (1999) and references cited therein; W. Su, T. M. Cooper; Chem. Mater. 10, 1212 (1998); J. W. Perry et al., Science 273, 1533 (1996); K. A. Nguen et al., J. Chem. Phys. 118, 5802 (2003.

None of these organic systems, however, have proved to be particularly versatile due to the inherent characteristics of the up-converting material present in the corresponding system. Furthermore in most cases up-conversion could only be induced under conditions of very low temperatures, $-180°$ C. and below. Also, none of the optical limiting materials has been reported to show up-converting behaviour when this material is on its own.

SUMMARY OF THE INVENTION

Accordingly it has been an object of the present invention to provide for new materials and compositions capable of photon energy-up-conversion which compositions show a great versatility with respect to the radiation wavelengths involved, both incident and emitted. It has also been an object of the present invention to provide for materials and compositions which show an efficient up-conversion behavior even at low pump (i.e. irradiation) intensities. It has also been an object of the present invention to provide for materials and compositions which show an efficient up-conversion behaviour under ambient conditions, i.e. room temperature. Furthermore it has been an object of the present invention to enable such versatility also in compositions which are suitable for film-formation over large areas, thereby enabling the production of tailor-made opto-electronic devices.

All these objects are solved by a composition for photon energy up-conversion comprising at least two components, wherein a first component is capable of absorbing energy at a first wavelength region $w \leq \lambda_1 \leq x$, which first component acts as a sensitiser in said composition, and wherein a second component is capable of emitting energy at a second wavelength region $y \leq \lambda_2 \leq z$, which second component acts as an emissive component in said composition, wherein $\lambda_2 \leq \lambda_1$, and wherein, upon absorption of energy by said first component at said first wavelength region $\lambda_1$, said emissive component emits energy at said second wavelength region $\lambda_2$, characterized in that said first component and/or said second component is an organic compound.

Preferably, said first component is a first organic compound and said second component is a second organic compound.

In one embodiment, said first component is neither covalently bonded nor complexed to said second component.

In another embodiment, said first component is covalently bonded to said second component, preferably in a manner that the two respective components can be distinguished by their physical location within the resulting molecule.

In another embodiment, said first component is complexed to said second component, with the proviso that the resulting comples shows an up-conversion behaviour which is based on sequential two-photon or multi-photon excitation.

In one embodiment, said first and said second organic compounds are different compounds.

In one embodiment, said organic compound, in particular said first and said second organic compound, is a carbon-containing compound, with the proviso that it is not a hydrogen-free chalcogenide of carbon, a derivative thereof, a salt-like carbide, a metallic carbide or a metal-carbonyl.

Preferably, said emissive component's emitting energy at said second wavelength region $\lambda_2$ is due to an up-conversion process based on direct or sequential two-photon excitation or on direct or sequential multi-photon excitation or on excitation of molecules populating high vibrational state(s) ("hot-band absorption"), which up-conversion process occurs upon absorption of energy by said first component (i.e. sensitiser) at said first wavelength region $\lambda_1$.

In one embodiment, said second wavelength region $\lambda_2$ is in the range 360-750 nm and said first wavelength region $\lambda_1$ is in the range 500-1500 nm.

It is preferred that said first (i.e. sensitiser) component is an organic dye, in particular a TPA-dye, or an optical limiting compound, including fullerenes, carbon nanotubes, inorganic nanoparticles or inorganic nanocrystals.

It is furthermore preferred that said second (i.e. emitter) component is an organic dye or an inorganic emissive component. In one embodiment at least one of said first component (i.e. sensitiser) and said second component (i.e. emitter) is an organic component, where, if the sensitiser is an organic component, it is an organic dye, a direct and/or sequential two-photon absorbing dye, i.e. a TPA-dye, or any optical limiting compound, a fullerene or carbon nanotubes.

In a preferred embodiment said first component (i.e. sensitiser) is a first organic dye and said second component (i.e. emitter) is a second organic dye, wherein said first and said second organic dyes are different.

In one embodiment said organic dye, in particular said first and/or said second organic dye is selected from the group comprising organic dyes capable of direct and/or sequential two-photon excitation, organic dyes capable of direct and/or sequential multi-photon excitation, and organic dyes capable of hot-band absorption.

In one embodiment, said organic dye, in particular said first and/or said second organic dye, is selected from the group comprising styryl dyes, benzothiazole-containing two-photon chromophores, polyfluorenes, polyparaphenylenes, porphyrins, phthalocyanins, phthalocyanin complexes, xanthenes and, rhodamines, wherein preferably said first organic dye (i.e. sensitiser) is selected from the group comprising compounds showing non-linear absorption characteristics, e.g. direct or sequential two/multi-photon absorbing dyes, in particular optical limiting compounds. More preferably the sensitiser is selected from the grooup comprising: direct TPA dyes—styrylö dyes, benzothiazole- containing TPA chromphores, donor-acceptor para substituted aromatic compounds, e.g. with a structure D-Ar-A, xanthenes and rhodamines, perylene derivatives, optical limiting compounds (sequential two/multiphoton absorption)—porphyrins and phthalocyanins (including metalloporphyrins and metallophthalocyanins), metallonaphthalocyanines, porphyrin and phthalocyanin complexes (including metalloporphyrins and metallophthalocyanins, as well as dimers and polymers or arrays of porphyrin and phthalocyanin molecules (including metalloporphyrins and metallophthalocyanins), indanthrone derivatives and oligomers.

More preferably, the sensitiser is selected from the group comprising porphyrins and phthalocyanins, including metalloporphyrins, (including Cu—, Pd—, Zn—, Pt-porphyrins), metallophthalocyanins, porphyrin complexes, phthalocyanin complexes, dimers/polymers as well as arrays of porphyrin or phthalocyanin molecules. Said second organic dye (i.e. emitter) is preferably selected from the group comprising compounds showing fluorescence emission in the range 360-750 nm, in particular fluorescent dyes showing fluorescence emission in the range 360 nm-750 nm, e.g. polyfluorenes and oligofluorenes (with or without any sidechain pattern) and their copolymers, polyparaphenylenes, including polyparaphenylene vinylene, and polyphenyleneethinylenes.

More preferably, said first organic dye (i.e. sensitiser) is a porphyrin, or a metalloporphyrin in particular Octaethylporphyrin-Palladium (or —Pt or —Cu or —Zn), or a phthalocyanin, and said second organic dye (i.e. emitter) is a polyfluorene or oligofluorene (with or without (different) side chain patterns), in particular PF ⅔. It should be noted that, in one embodiment of the present invention, where the sensitiser and the emitter are organic compounds, which may be polymerisable, these may be occurring in the same polymer, i.e. they may form part of the same polymer molecule, either as block copolymer or random copolymer or a sensitiser/or emitter polymer wherein the respective other component forms end-capping groups. This may e.g. be a polymer of sensitiser components which is end-capped with emitter components, or vice versa. Polymers as just described are examples of where the two components are covalently bonded to each other.

In one embodiment, said first and said second component are dispersed into a matrix, wherein, preferably, said matrix does not take part in an up-conversion-process.

In one embodiment, said first component is dispersed into a matrix formed by said second component.

In another embodiment, said second component is dispersed into a matrix formed by said first component.

In yet another embodiment, said first component forms a first layer and said second component forms a second layer on top of or underneath said first layer.

In another embodiment, said first and said second components form a multi layer structure, wherein said first component is present in a first subset of layers and said second component is present in a second subset of layers, which first subset of layers is the same or different or partially the same as said second subset of layers. In one embodiment the concentrations of said first and said second component vary from layer to layer within their respective subset of layers. It should be noted, that the only criterion which needs to be ensured for these layered structures is that a successful energy transfer between said first and said second components may take place. This can be achieved by choosing, the appropriate thickness of these layers, which thickness of each layer may lie in the range of from 1-100 nm, preferably 1-50 nm, more preferably 1-20 nm, most preferably 1-10 nm.

In an alternative embodiment, said first and said second components from a multilayer structure, wherein said first and said second components are present together as a composition in all or a subset of layers, wherein, preferably, their concentration, i.e. the concentration of this composition of said first and said second component, is varied from layer to layer.

The objects of the invention are also solved by a photon-energy up-conversion system comprising:
a substrate,
the composition as defined above.

Preferably, the system according to the present invention is a photovoltaic device, in particular a solar cell, or which is an LED, a lasing medium, a sensor, in particular a chemical sensor, a temperature sensor, or a label, preferably in biological/biochemical systems.

The objects of the invention are also solved by the use of the composition or the system According to the present invention, in a solar cell, an LED, a lasing medium, a sensor, in Particular a chemical sensor, a temperature sensor, or a label, preferably in biological/biochemical systems.

The objects of the present invention are furthermore solved by a composition for photon energy up-conversion comprising host molecules and guest molecules, wherein said host Molecules emit light upon excitation of said guest molecules, or wherein said guest molecules emit light upon excitation of said host molecules, characterized in that said host molecules and/or said guest molecules are organic molecules, wherein, preferably, said organic molecules are carbon-containing molecules, with the proviso that they are not hydrogen-free chalcogenides of carbon, their derivatives, salt-like carbides, metallic carbides or metal-carbonyls.

In one embodiment, said guest molecules are capable of absorbing energy at a first wavelength region $w \leq \lambda_1 \leq x$, which guest molecules act as sensitising molecules in said composition, and wherein said host molecules are capable of emitting energy at a second wavelength region $y \leq \lambda_2 \leq z$, which host molecules act as emissive molecules in said composition, wherein $\lambda_2 \leq \lambda_1$, and wherein, upon absorption of energy by said guest molecules at said first wavelength region $\lambda_1$, said host molecules emit energy at said second wavelength region $\lambda_2$, or characterized in that said host molecules are capable of absorbing energy at a first wavelength region $w \leq \lambda_1 \leq x$, which host molecules act as sensitising molecules in said composition, and wherein said guest molecules are capable of emitting energy at a second wavelength region $y \leq \lambda_2 \leq z$, which guest molecules act as emissive molecules in said composition, wherein $\lambda_2 \leq \lambda_1$, and wherein, upon absorption of energy by said host molecules at said first wavelength region $\lambda_1$, said guest molecules emit energy at said second wavelength region $\lambda_2$.

In one embodiment, said host molecules are selected from the group comprising compounds showing non-linear absorption characteristics, in particular direct and/or sequential two/,ultiphoton absorbing dyes. More preferably, where host molecules act as sensitisers, said host molecules are selected from the group comprising porphyrins and phthalocyanins, including metalloporphyrins, metallophthalocyanins, alkylporphyrins, porphyrin complexes, alkylporphyrin-metal complexes, phthalocyanin complexes, dimers/polymers as well as arrays of porphyrin or phthalocyanin molecules. Where the guest-molecules act as emitters, said guest molecules are preferably selected from the group comprising compounds showing fluorescence emission in the range 360-750 nm, in particular fluorescent dyes showing fluorescence emission in the range 360 nm-750 nm, e.g. polyfluorenes and oligofluorenes (with or without any sidechain pattern) and their copolymers, polyparaphenylenes, including polyparaphenylene vinylene, polyphenyleneethinylenes, more preferably polyfluorenes with alkyl sidechains and/or end-capping groups, e.g. PF2/6.

More preferably, said sensitiser is porphyrin, in particular Octaethylporphyrin-Palladium (or Cu, Zn, Pt), or a phthalocyanin, and said emitter is a polyfluorene or oligofluorene (with or without (different) side chain patterns), in particular PF 2/6.

In one embodiment, said guest molecules are neither covalently bonded nor complexed to said host molecules.

In one embodiment, said guest molecules and said host molecules are dispersed into a matrix, wherein, preferably, said matrix does not take part in an up-conversion process.

In one embodiment, said guest molecules are dispersed into a matrix formed by said host molecules.

In another embodiment, said host molecules are dispersed into a matrix formed by said guest molecules.

In yet another embodiment, said guest molecules form a first layer and said host molecules form a second layer on top of or underneath said first layer.

In yet a further embodiment, said guest molecules and said host molecules form a multi-layer structure wherein said guest molecules are present in a first subset of layers and said host molecules are present in a second subset of layer, which first subset of layers is the same or different or partially the same as said second subset of layers.

The objects of the present invention are also solved by a photon-energy up-conversion system comprising:
a substrate,
the composition as defined above, wherein, preferably the system is a photovoltaic device, in particular a solar cell, or which is an LED, a lasing medium, a sensor, in particular a chemical sensor, a temperature sensor, or a label, preferably in biological/biochemical systems.

The objects of the present invention are furthermore solved by the use of the composition or the system as defined above in a solar cell, LED, a lasing medium, a sensor, in particular a chemical sensor, a temperature sensor, or a label, preferably in biological/biochemical systems.

All of the organic systems described in the prior art (see above) only have one active component present, i.e. active in the sense of showing an up-conversion activity. In this single active component, the absorption and emission takes place at and within the same type of molecule. Thereby, the application of such a system is greatly limited by the inherent characteristics of this molecule, and typically up-conversion only takes place at very low temperatures. The present inventors have found, however, that by using more than one active component in a system/composition, the process of absorption can be separated from the process of emission and can also be separately influenced, depending on the choice of material used for each purpose. Also, most surprisingly, systems can be created wherein the individual components, when on their own, do only show very inefficient up-conversion-activity i.e. they require high light intensities and very low temperatures. Some compounds show up-conversion as a result of a direct two-photon excitation, but the irradiation intensities ("pumping intensities") need to be very high (GW (cm$^2$)). This is for example the case with polyfluorenes. If a sensitiser is direct two-photon excited and is also capable of up-conversion itself, or if the sensitiser has optical limiting characteristics, a much more efficient up-conversion can be achieved via energy transfer to an emitter (i.e. second component), e.g. a polyfluorene. This also surprisingly works if the sensitiser is an optical limiting compound, whereby energy transfer takes place from the higher excited states of the sensitiser to the second (i.e. emitter) component which then emits up-converted radiation. Up till now there has been no report on up-conversion process involving these higher excited states of optical limiting components.

The first and second (and third, fourth, etc. . . . ) active component (i.e. emitters and sensitisers) are chosen such that the excited energy levels of the "sensitiser" component(s) (the component absorbing energy) match the energy level of the emitter component(s). Also several sensitisers can act in a series provided their respective energy levels match.

In particular, in some embodiments of the invention, a "sensitiser" is a non-linear absorber which means that it shows absorption characteristics which do not show linear behavior, in particular with light at high incident irradiation. Where the absorption is the result of a direct two-photon-excitation process, the sensitiser has to have a high enough TPA cross-section. In the case where there is a sequential two-multi-photon excitation, whereby the sensitiser becomes an optical limiting compound, in most cases it is a reverse seturable absorber (RSA). These systems are defined as having an absorption in the excited state (singlet or triplet) higher than the absorption of the ground state. Their absorption scheme is usually described in a five- or six-level model, which is shown in FIG. 8. In this figure, S0 is the ground singlet state, S1, Sx, Sn—the excited singlet states, T1 and Tn are the triplet states. $\sigma 01$, $\sigma 12$ and $\sigma 34$ are the corresponding absorption cross-sections, k10, k21 and k43 are the corresponding decay rates. The performance of these compounds is characterized by the ratio of the excited state—to the ground-state-absorption (including singlet and triplet levels) and by the saturation intensity or fluence. For a good performance (i.e. for a good up-conversion behavior) the ratio of the excited-state-absorption to ground-state-absorption is large, whereas the saturation intensity or fluence is low.

The "emitter" component (i.e. the second component) ought to have an emissively relaxing excited energy level at a position to which the excitation energy transfer can take place from any of the high excited states (i.e. singlet Sn or triplet Sn) of the sensitiser component. Furthermore a higher fluorescence quantum efficiency of the emitter component is important and preferred.

By the present invention a greater versatility is achieved in that the possibility to combine the properties of at least two independently active compounds, a new system/composition is created having a variety of properties which are not shown by each component, when on its own. For example, the absorbing molecules, i.e. "sensitiser" molecules can be varied, whereby the lower energy wavelengths to be up-converted can be varied. Alternatively or in addition thereto, the emissive molecule can be varied thereby allowing a variation of the higher energy wavelengths of the up-converted emission. In using at least one organic compound, either as sensitiser or as emitter, or by using organic compounds for both, it is also possible to make use of the good film-forming properties of organic compounds thereby making the compositions according to the present invention particularly amenable for large-area opto-electronic devices.

As used herein the term "organic" is used in its generally understood meaning, i.e. it refers to compounds which are carbon-containing compounds. As it is used here, it also includes elemental carbon, at least in the form of fullerenes. The term "organic" is further meant to exclude specific carbon-containing compounds such as: hydrogen-free chalkogenides of carbon, e.g. CO, $CO_2$, $CS_2$, and derivatives thereof, e.g. $H_2CO_3$, KSCN; further excluded are salt-like carbides which are binary compounds of elements with carbon, which decompose to hydrocarbons under the influence of water or dilute acids. Salt-like carbides have the general formula $M^I{}_2C_2$ or $M^{II}C_2$, wherein $M^I$ or $M^{II}$ denotes a metal ion with one or two valences. Salt-like carbides of calcium, silver and copper decompose to acetylene, the salt-like carbide of aluminium ($Al_4C_3$) decomposes to methane. Further excluded carbon-containing compound which do not form part of the term "organic" are metallic carbides, which are non-stoichiometric compounds having the character of an alloy. They are resistant to acids and are electrically conducting. Further excluded from the term "organic", as used herein, are metal-carbonyls where carbon monoxide molecules are coordinatively bound to elemental metal atoms, for example iron carbonyl (e.g. $Fe_2(Co)_9$, $Fe_3(Co)_{12}$, chromium carbonyl $Cr(Co)_6$, cobalt carbonyl $(Co_2(CO)_8$, nickel carbonyl $Ni(CO)_4$ etc.).

As used herein, the term "nanoparticles" is meant to denote particles which have a size in the range of 1-750 nm, preferably 5-500 nm, or more preferably 5-250 nm. These nanoparticles may also exhibit crystalline behaviour in which case they are also referred to as "nanocrystals".

As used herein, the term "nanotubes" is meant to denote tube-like structures preferably of carbon, the dimensions of which are of the same order of magnitude as of "nanoparticles", as defined above.

As used herein the terms "host molecules" and "guest molecules" are meant to denote two types of molecule, different from each other, wherein the molecules, which are referred to as "guest molecules", are embedded in a matrix formed by the (other) molecules, referred to as "host molecules".

BRIEF DESCRIPTION OF THE DRAWINGS

Reference is now made to the figures, wherein.

DETAILED DESCRIPTION OF THE INVENTION

The invention is now further described with reference to the following examples which are hereby given not to limit but to illustrate the invention.

EXAMPLE 1

Figure 1:
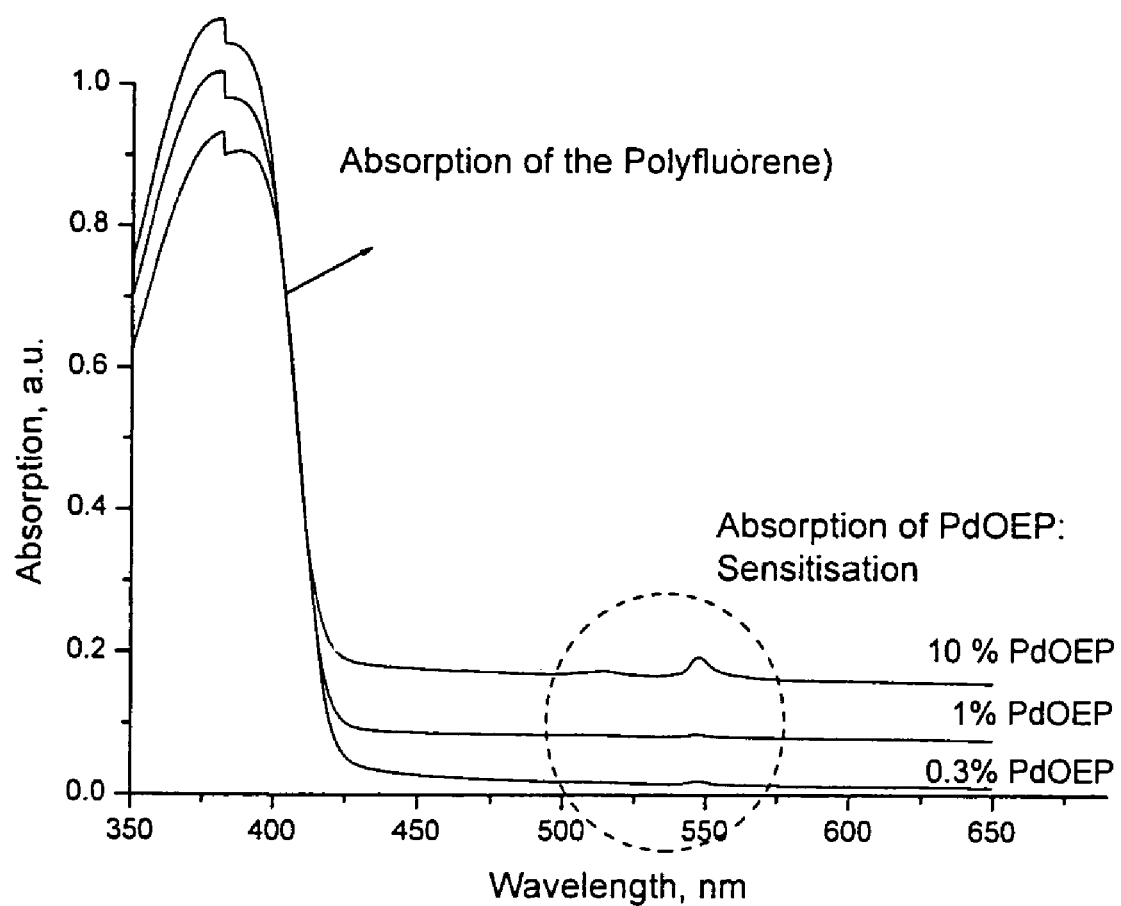
FIG. 1 shows absorption spectra of a polyfluorene (PF2/6=poly(2,7-(9,9-bis(2-ethylhexyl)fluorene) which acts as emissive component in a composition where different concentrations of octaethylporphyrin-Pd(PdOET) are dispersed as sensitiser molecules, FIG. 2 shows the structure of molecules, which were successfully used as emitters and/or sensitisers according to the present invention, in particular of polyfluorenes, metalloporphyrins and phthalocyanins, FIG. 3 shows the phenomenon of up-conversion, wherein PF2/6 is doped with 1 wt. % PdOET and is pumped (i.e. irradiated by laser) with 40 µW at 405 nm (quasi continuous wave (cw) laser beam) (FIG. 3a), with 120 mW at 532 nm (FIG. 3b) and with both wavelengths at the aforementioned intensities (FIG. 3c), all irradiations are for 200 ms.

FIG. 1 shows the absorption spectra of a Polyfluorene (PF26 or PF2/6) (=poly(2,7-(9,9-bis(2-ethylhexyl)fluorene (emissive molecules) and PF26 with dispersed different Concentrations of Octaethylporphyrin-Pd (PdOEP) (sensitiser molecules).

EXAMPLE 2

Figure 2A:
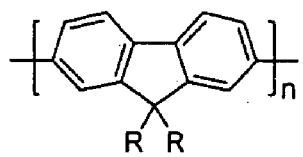
Figure 2A:
Figure 2A:
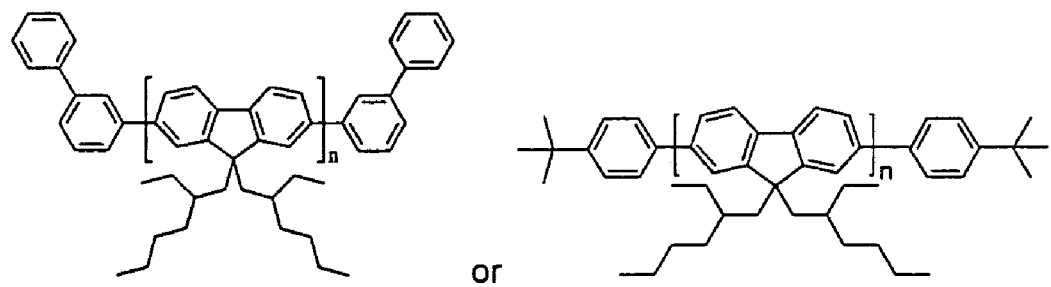

The following compounds have been successfully used as emitters and/or sensitisers in the present invention:

a) Polyfluorenes, as Shown in FIG. 2a

Figure 2B:
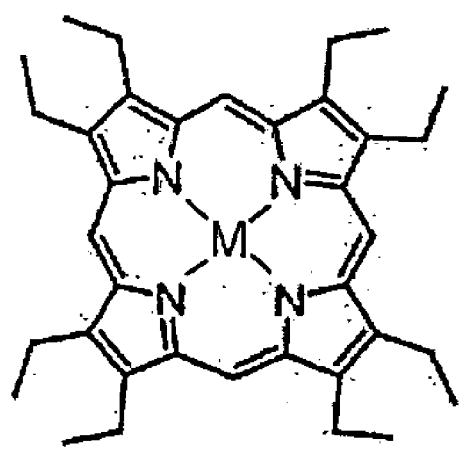
Figure 2C:
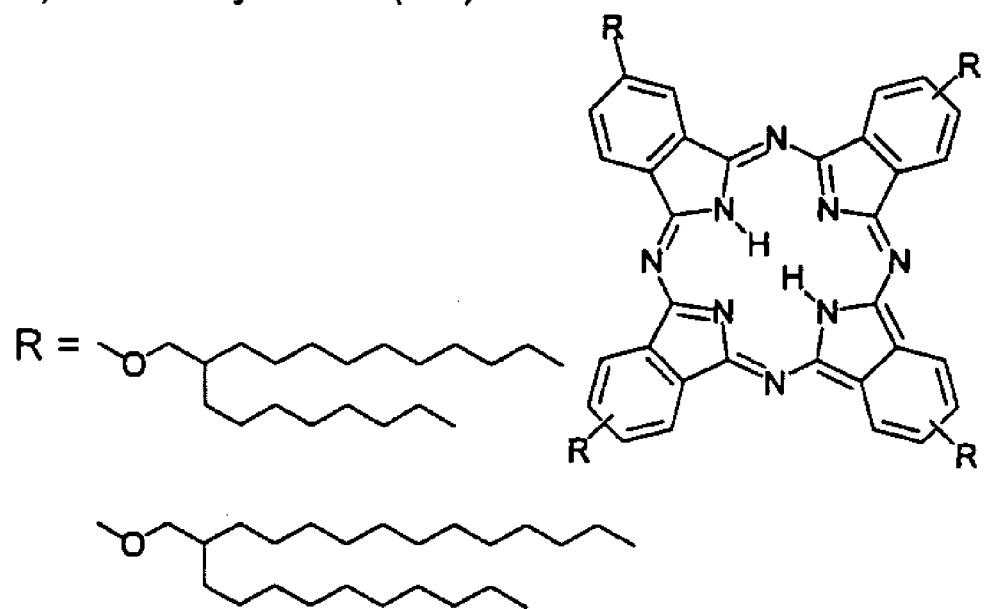

The side-chain-pattern might vary. This is the structure used in the examples with varying molecular weight. End-capped polyfluorenes and oligofluorenes have been used and are working in similar manner. It should be noted, that any polyfluorene may be used wherein the side chain, denoted by R may vary and the invention is in no way limited to the ones shown in FIG. 2a. Furthermore end-capped polyfluorenes and oligofluorenes may be used, such as are disclosed in European patent application EP00108877.2, filed on Apr. 26, 2000, which is hereby incorporated by reference. It should be noted, however, that for the purposes of the present invention, the end-capping groups may be, but do not need to be charge transporting, as they were in the mentioned application. Two examples of such end-capped polyfluorenes having no charge-transport end-capping groups at their respective ends are the two structures shown at the bottom of FIG. 2a, which have a biphenyl-group and a phenylisobutyl group respectively as end-capping groups.

b) Metalloporphyrines, as Shown in FIG. 2b

Figure 3A:
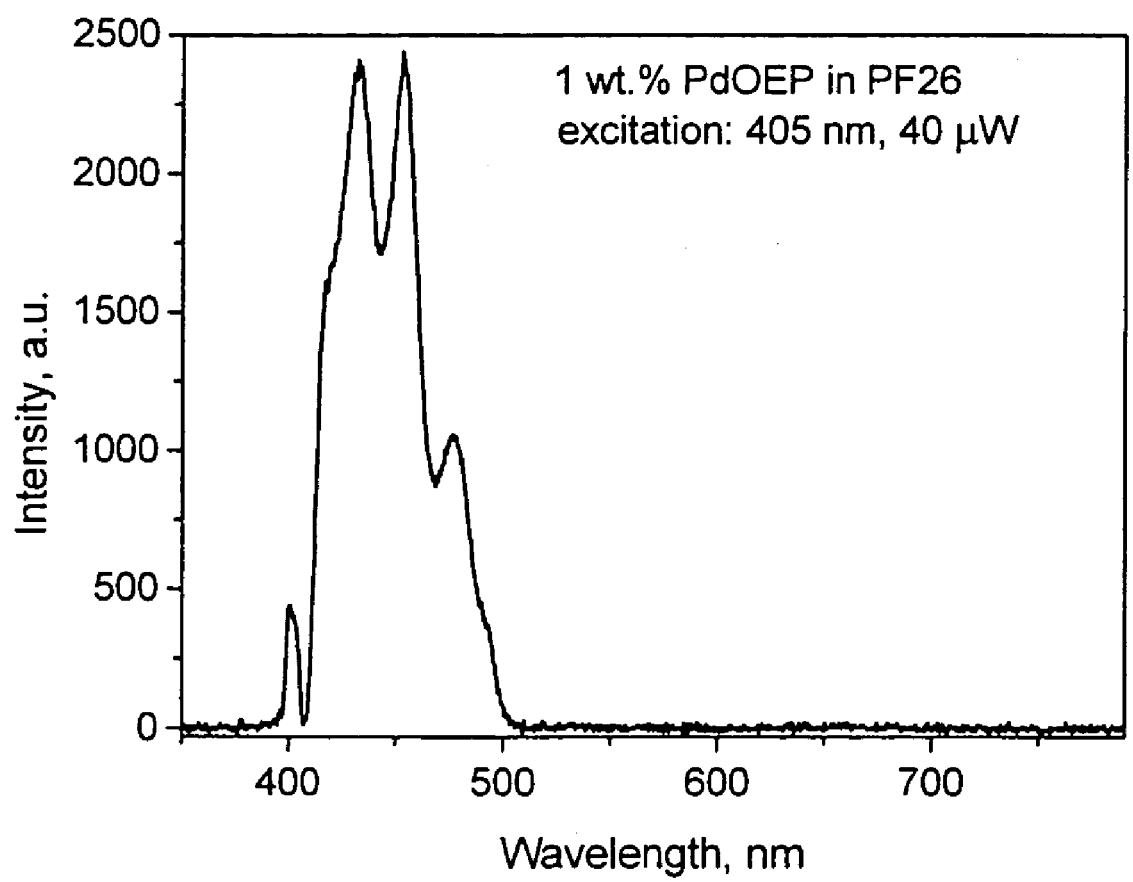
Figure 3B:
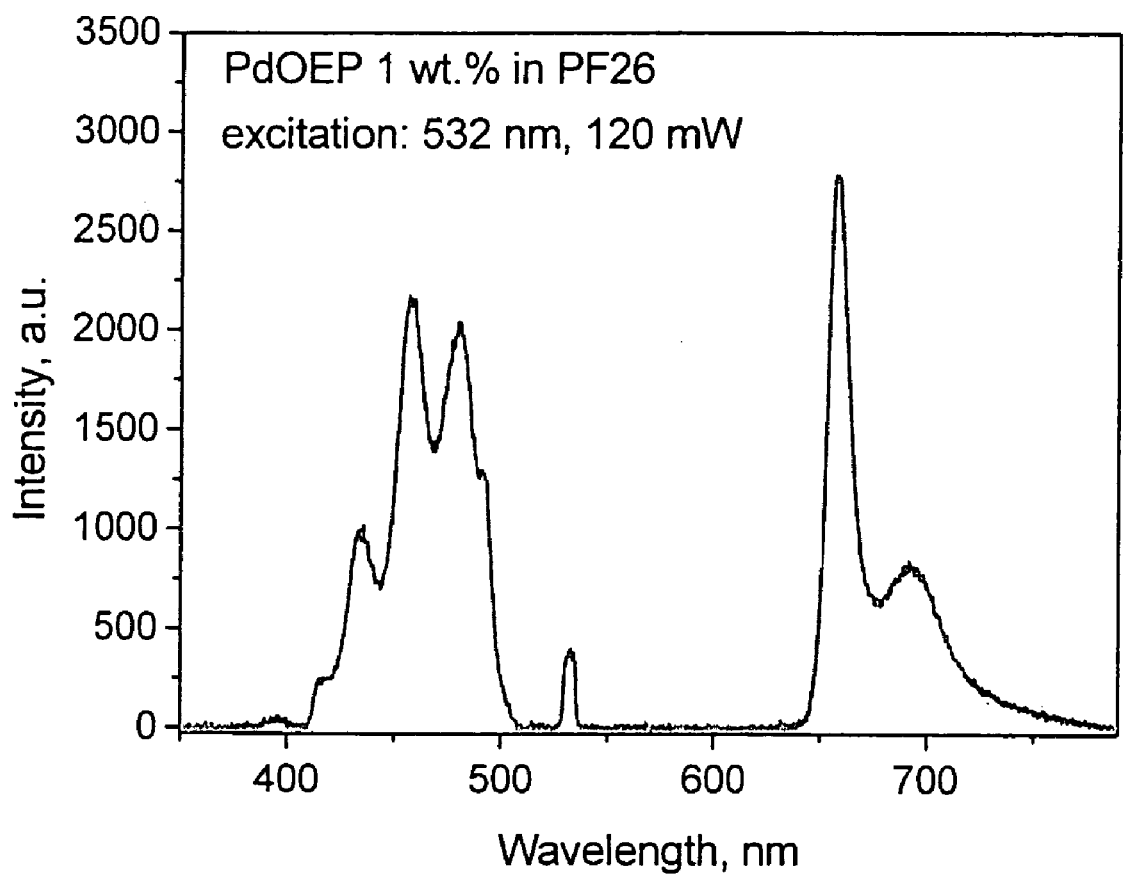
Figure 3C:
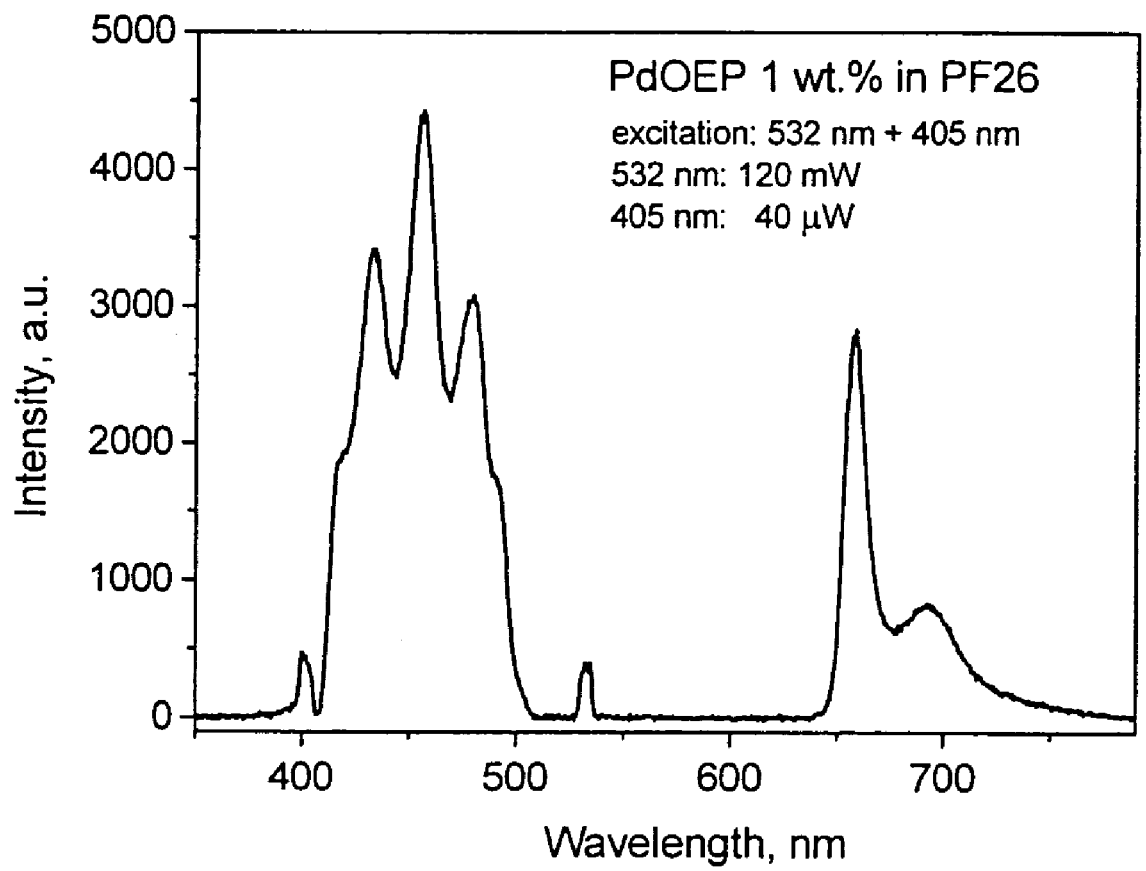

The metal (=M) and the substituents can be different, examples for the metal include Cu, Zn, Pd, and Pt.

c) Phthalocyanin (Pc) as Shown in FIG. 3c, Wherein Two Possible Sidechains are Depicted.

EXAMPLE 3

FIG. 3 shows a demonstration for up-conversion in a multicomponent system. The emitter is PF26 doped with 1 wt. % PdOEP sensitiser. The pumping is with 40 µW 405 nm, 120 mW 532 nm or the sum of the two.

In FIG. 3a), the pumping is 405 nm, 200 ms 40 µW laser diode. The irradiated spot is ca 4 µm in diameter.

In FIG. 3b) the pumping is 405 nm, 200 ms 40 µW laser diode+532 nm 200 ms, 120 mW laser. Irradiated spot ca 4 µm diameter.

In FIG. 3c), the pumping is 532 nm, 200 ms, 120 mW laser. Irradiated spot ca 4 µm diameter.

EXAMPLE 4

Figure 4A:
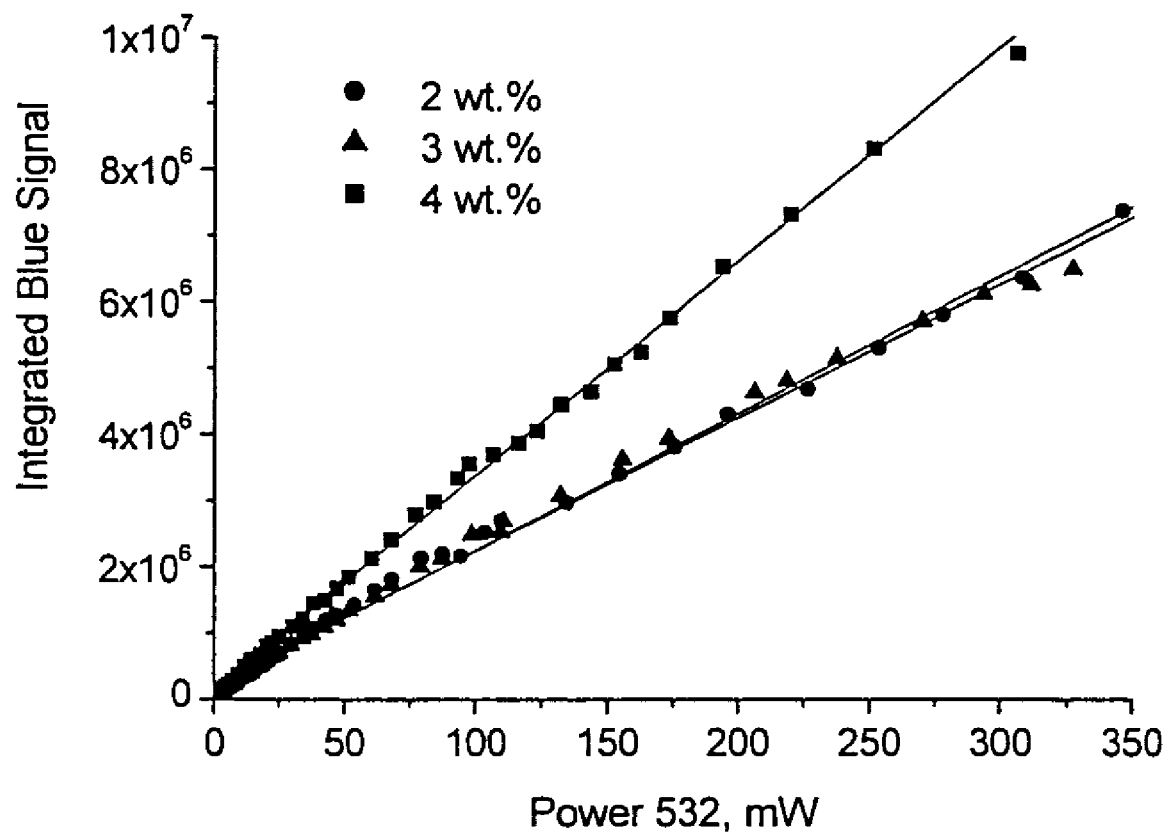
FIG. 4 shows the up-conversion process, where PF2/6 is doped with different concentrations of PdOET (0.3 wt. %, 1 wt. %, 10 wt. %, and 2 wt. %, 3 wt. %, 4 wt. %), where the integrated blue signal, i.e. intensity, is plotted against the power of the irradiation of the excitation wavelength.
Figure 4B:
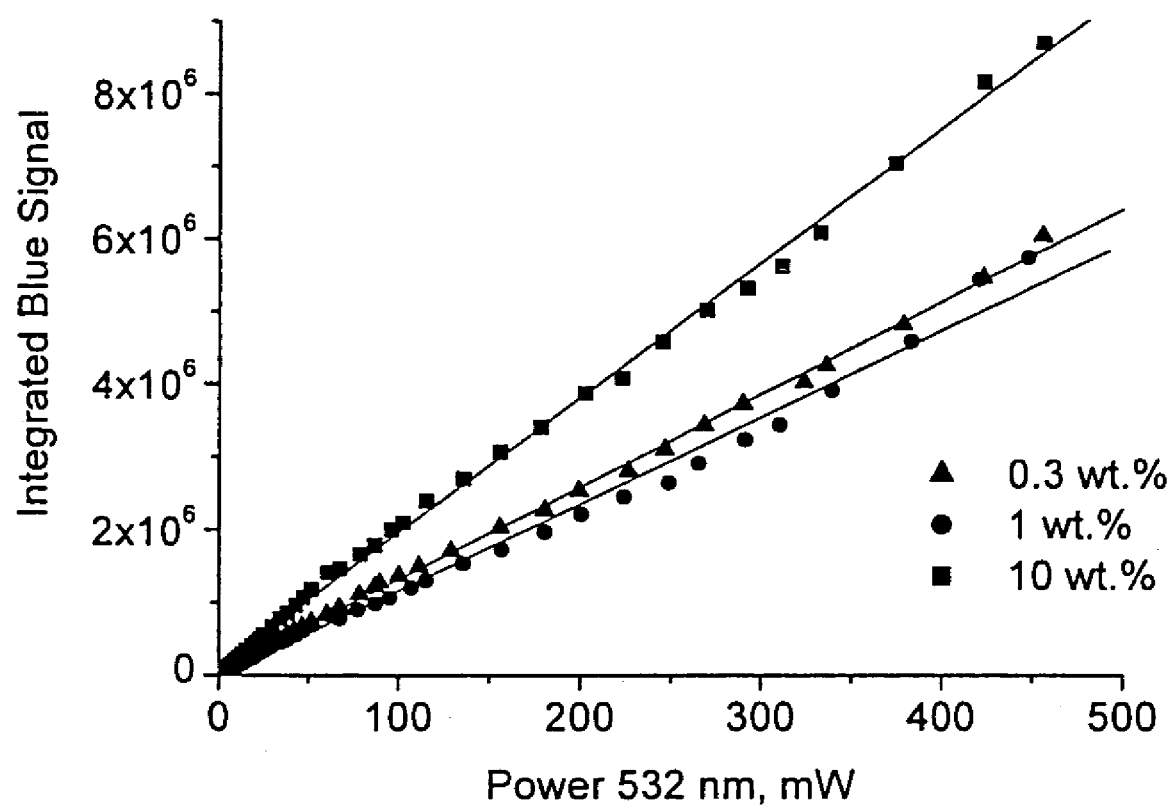

FIG. 4 shows the demonstration for up-conversion in a multicomponent system. The emitter is PF26 doped with different concentration of PdOEP sensitiser (FIG. 4a: 2,3,4 wt. %, FIG. 4b: 0.3,1 and 10 wt. %). The pumping is 120 mW 532 nm laser, 200 ms irradiation time. It should be noted that the lowest pumping intensity at which up-conversion is registered is 16 kW/cm$^2$ and is defined by the set-up sensitivity; this is 6 orders of magnitude more efficient than systems reported previously.

EXAMPLE 5

Figure 5A:
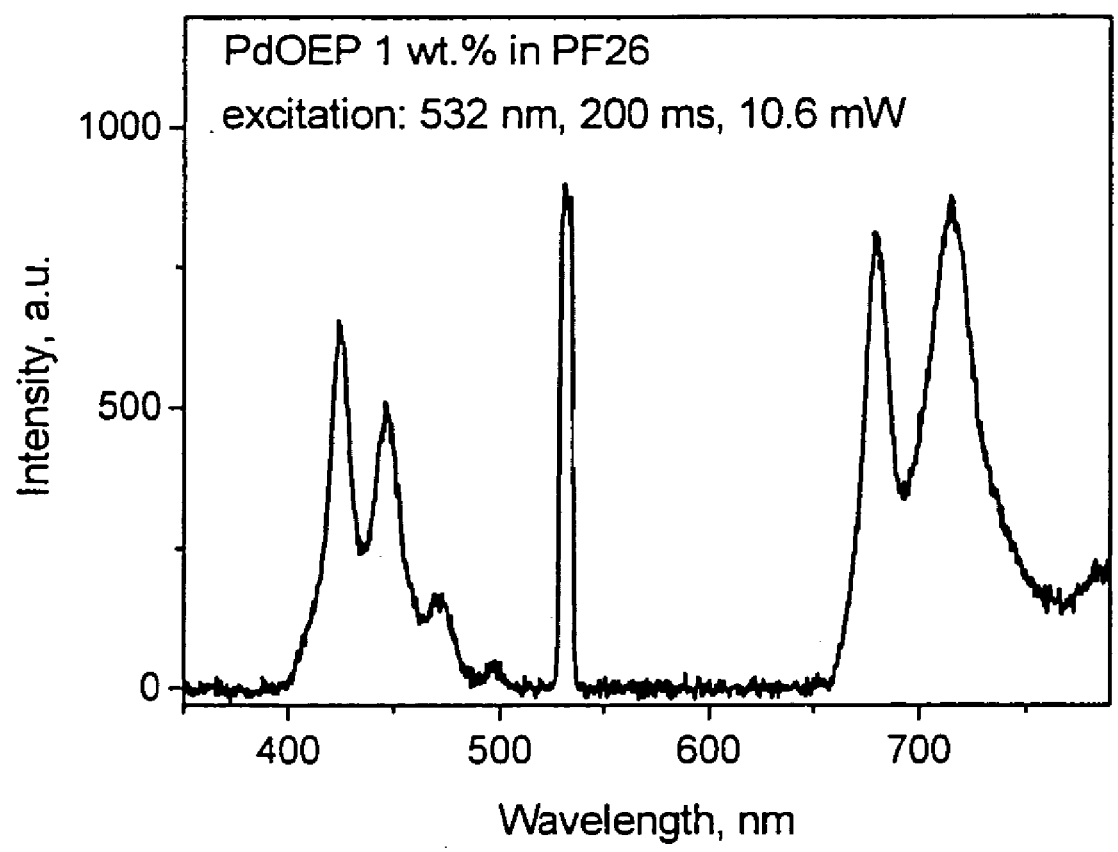
FIG. 5 shows the phenomenon of up-conversion, wherein PF2/6 as emitter is doped with 1 wt. % PdOEP as the sensitiser.
Figure 5B:
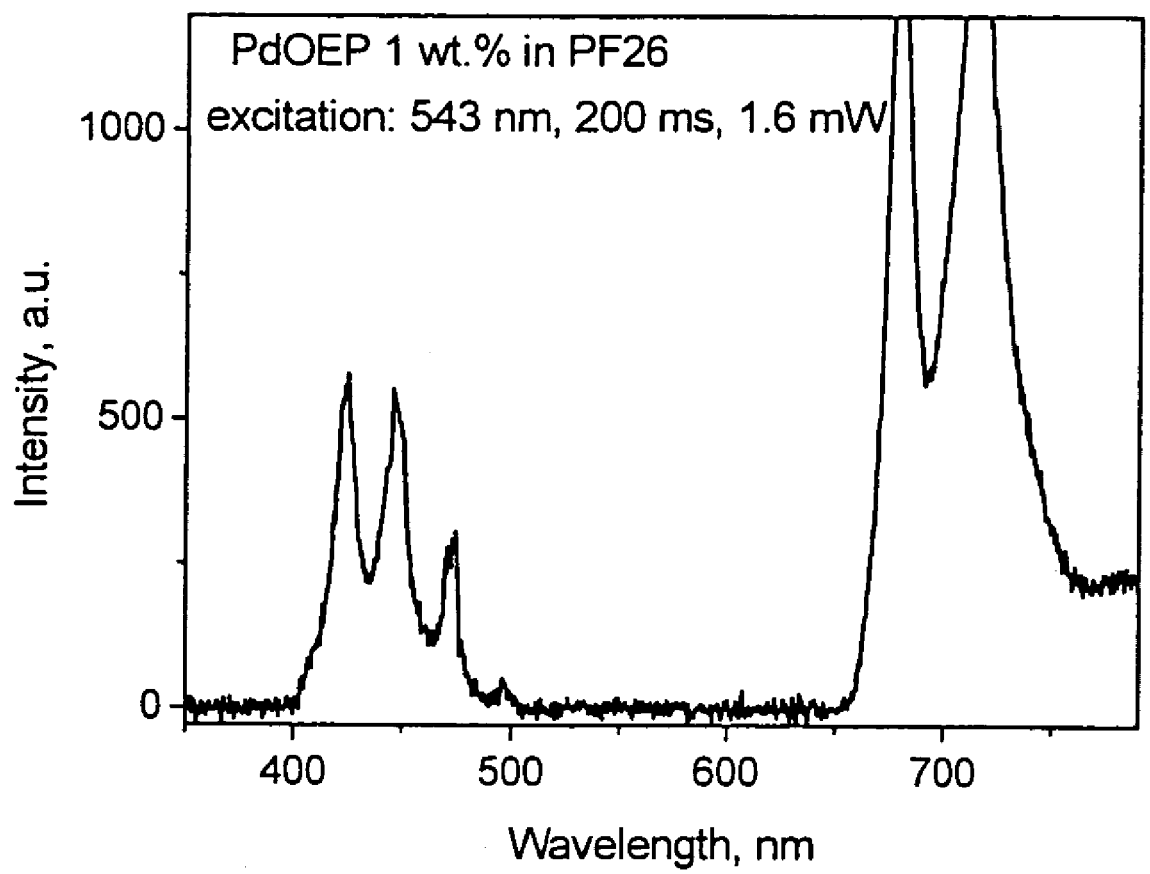

FIG. 5 shows the demonstration for up-conversion in a multicomponent system. The emitter is PF26 doped with 1 wt. % PdEP sensitiser. The pumping is with (a) 8.6 mW, 200 ms, 532 nm, solid state laser or (b) 1.6 mW 543 nm line HeNe laser 200 ms. The irradiated shot in both cases is ca. 4 µm in diameter. As the wavelength of 543 nm is closer to the absorption maximum of 549 nm (see Example 1) the sensitiser compound, the efficiency is much higher when pumping with this wavelength in comparison to 532 nm pump.

EXAMPLE 6

Figure 6:
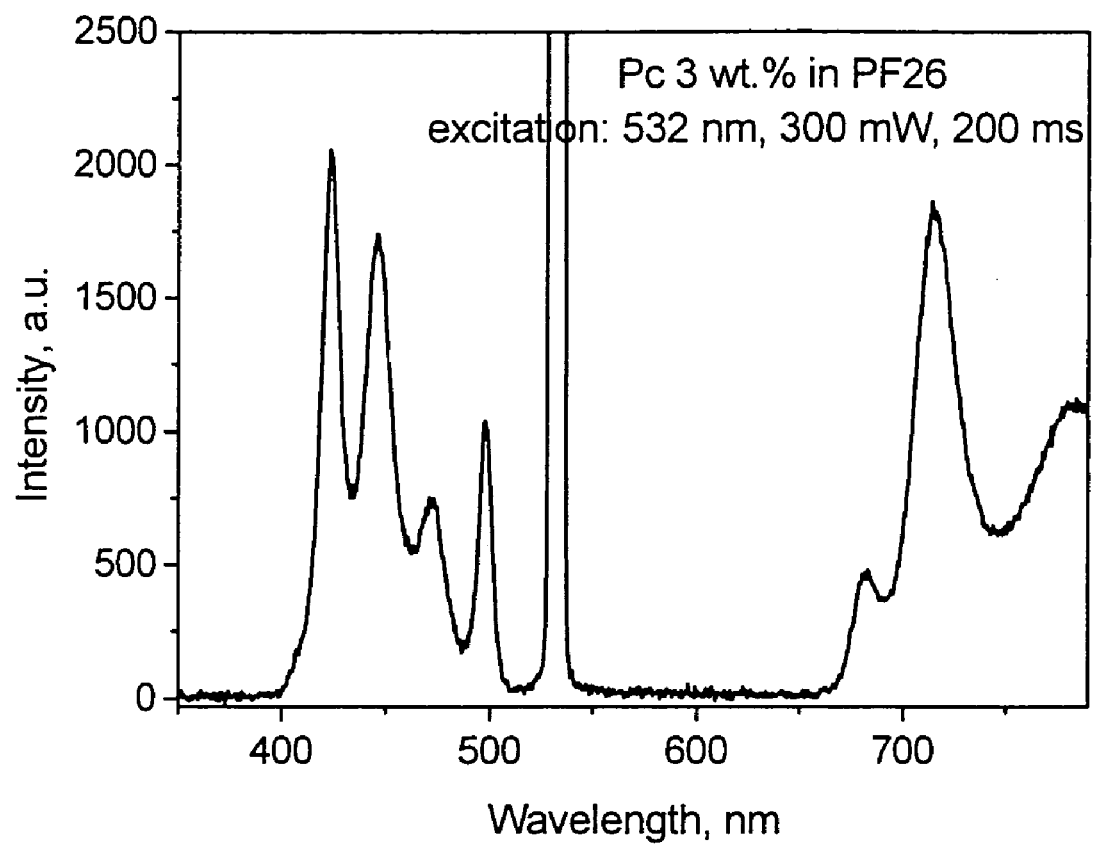
FIG. 6 shows the phenomenon of up-conversion, wherein PF2/6 as an emitter is doped with 3 wt. % of plastocyanin (Pc) as a sensitiser.

FIG. 6 shows the demonstration for up-conversion in a multicomponent system. The emitter is PF26 doped with 3 wt. % Pc (=plastocyanin) sensitiser. The pumping is with 300 mW, 200 ms, 532 nm, solid state laser. The irradiated spot ca. 4 µm in diameter.

EXAMPLE 7

FIG. 7 shows the demonstration for up-conversion in a multicomponent system. It illustrates the dependence of the integral intensity of the up-converted PF2/6 emission on the pumping intensity. The emitter is PF2/6, doped with 3 wt. % of different metal (Pt, Cu, Pd, Zn) porphyrin sensitisers. The pumping occurs with 200 ms, 532 run, solid state laser. The irradiated spot is ca. 4 µm i diameter.

Figure 7A:
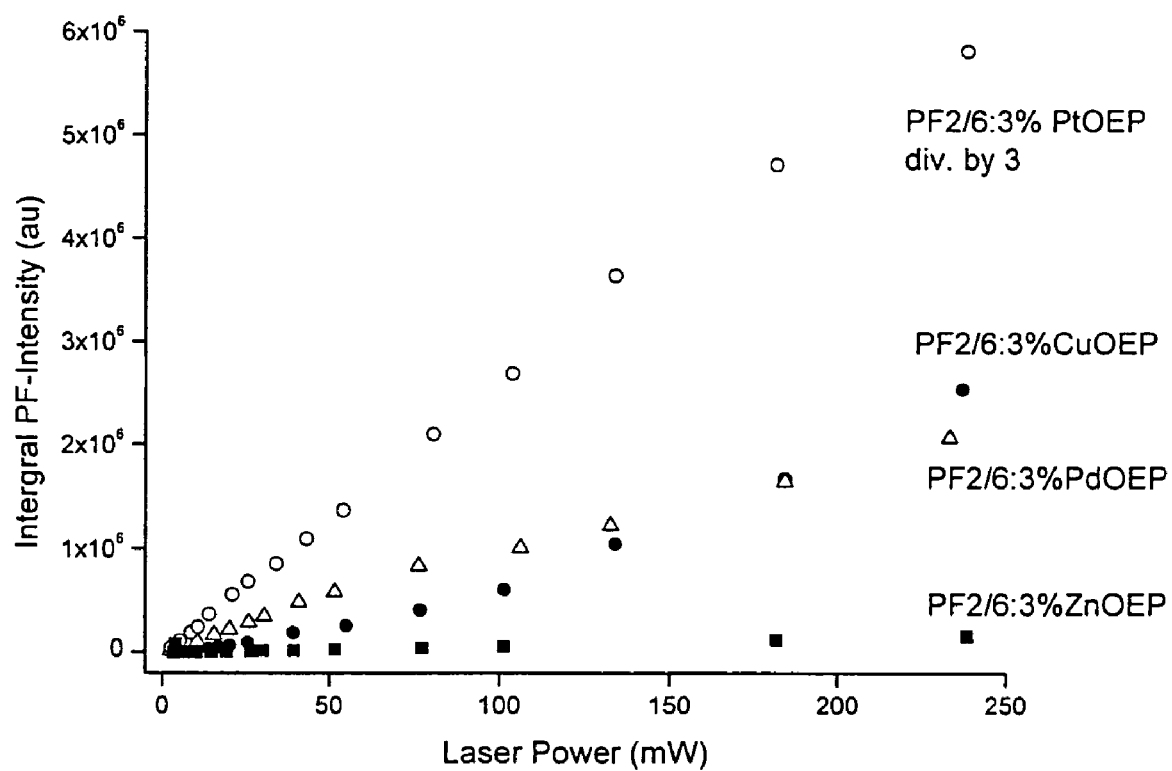
FIG. 7 shows the phenomenon of up-conversion, illustrating the dependence of the integral intensity of the up-converted PF2/6 emission on the pumping intensity, wherein the emitter is PF2/6 doped with 3 wt. % of different metal porphyrin sensitisers (metals are Pt, Cu, Pd, Zn), wherein FIG. 7a) shows the values for PF2/6 emission, with a PtOEP-sensitiser, which values are divided by three, (div. by 3) for reasons of comparison with other metalloporphyrins, FIG. 7b) shows the uncorrected PF2/6 emission values, (i.e. not divided by 3)
Figure 7B:
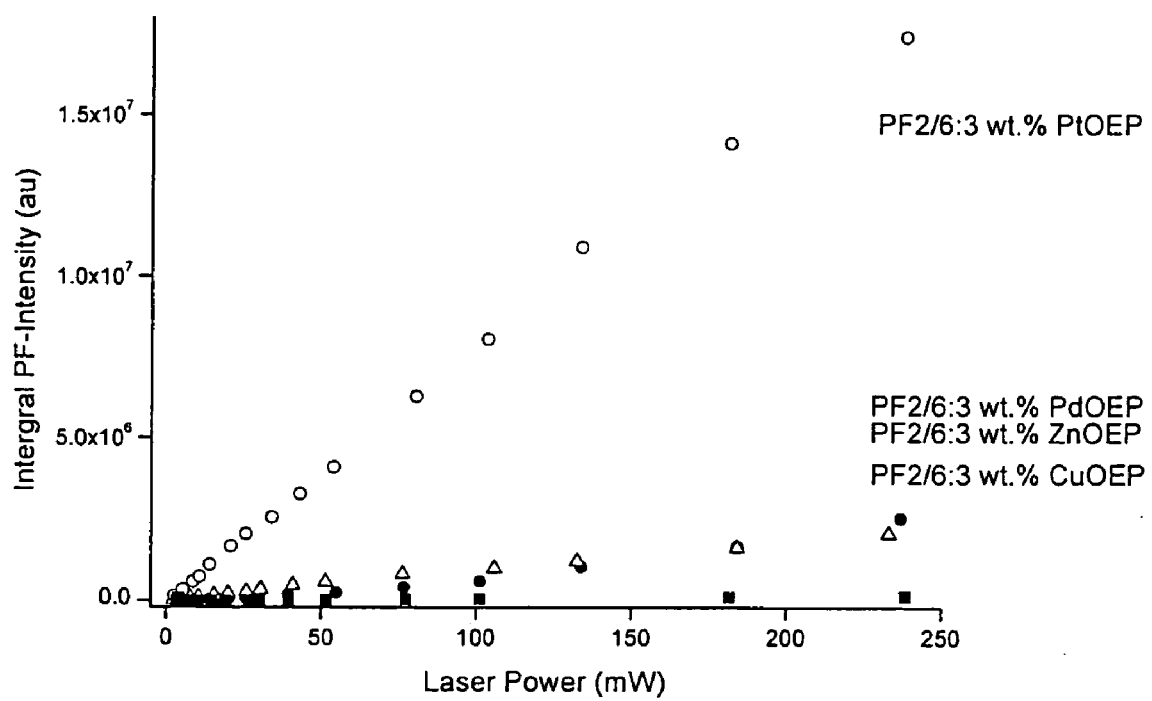
Figure 8:
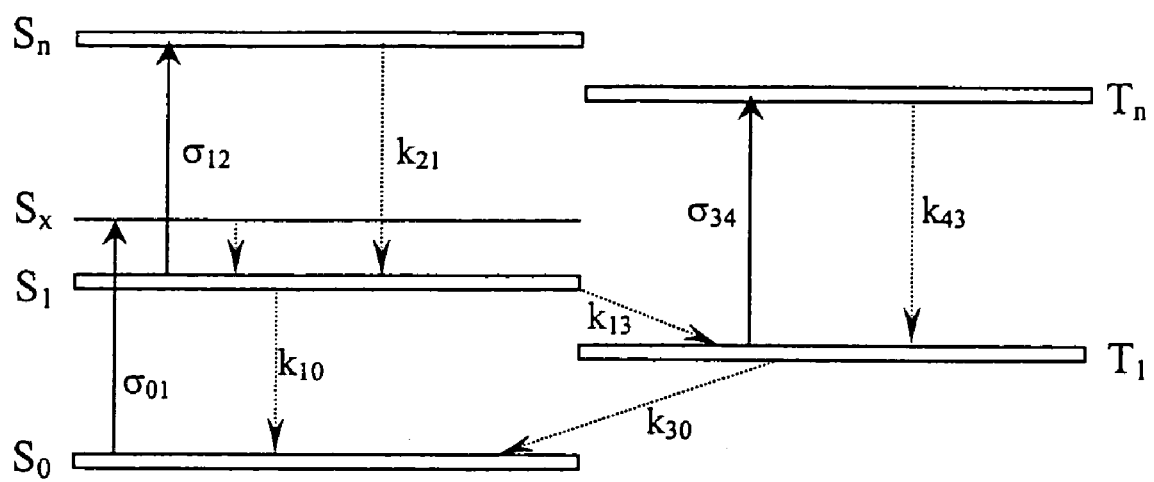
FIG. 8) shows a 5-level scheme of optical limiting compounds.

FIG. 7a) shows the values for the PF2/6 emission, when a PtOEP-sensitiser is used, which values are divided by 3 to enable a comparison with the other sensitiser systems; FIG. 7b) shows the same data for PtOEP sensitiser as measured and not corrected (i.e. not divided by 3, as far as the PtOEP values are concerned).

It should be noted, that the invention is not limited to a particular pulse length of irradiating light. Although in the previous examples, generally pulse lengths of 200 ms have been used, other lengths can be envisaged, covering the range of 500 fs up to hundreds of ms.

The features of the present invention disclosed in the specification, the claims and/or in the accompanying drawings, may, both separately, and in any combination thereof, be material for realising the invention in various forms thereof.

The invention claimed is:

1. A composition for photon energy up-conversion comprising:
    a first component capable of absorbing energy at a first wavelength region w≦λ$_1$≦x, the first component acts as a sensitizer in said composition; and
    a second component capable of emitting energy at a second wavelength region y≦λ$_2$≦z, the second component acts as an emissive component in said composition,
    wherein
    λ$_2$≦λ$_1$,
    upon absorption of energy by said first component at said first wavelength region λ$_1$, said emissive component emits energy at said second wavelength region λ$_2$,
    said first component is a first organic dye, said second component is a second organic dye, said first and second organic dyes are the same or different dyes, and at least one of said first and second organic dye comprises at least one of styryl dyes, benzothiazole-containing two-photon chromophores, polyfluorenes, polyparaphenylenes, porphyrins, phthalocyanins, phthalocyanin complexes, xanthenes, and rhodamines.

2. The composition according to claim 1, wherein said first organic dye is neither covalently bonded nor complexed to said second organic dye.

3. The composition according to claim 1, wherein said first and said second organic dyes are different organic dyes.

4. The composition according to claim 1, wherein said second wavelength region $\lambda_2$ is in the range 360-750 nm and said first wavelength region $\lambda_1$ is in the range 500-1500 nm.

5. The composition according to claim 1, wherein:

said first organic dye is selected from the group comprising compounds showing non-liner absorption characteristics, including two-photon absorbing (TPA) dyes, and said second organic dye is selected from the group comprising compounds showing fluorescene emission in the range 360-750 nm.

6. The composition according to claim 5, wherein said first organic dye is a porphyrin or metalloporphyrin and said second organic dye is a polyfluorene or oligofluorene with or without (different) side chain patterns.

7. The composition according to claim 1, wherein said first and said second organic dye are dispersed into a matrix.

8. The composition according to claim 7, wherein said matrix does not take part in an up-conversion-process.

9. The composition according to claim 1, wherein said first organic dye is dispersed into a matrix formed by said second organic dye.

10. The composition according to claim 1, wherein said second organic dye is dispersed into a matrix formed by said first organic dye.

11. The composition according to claim 1, wherein said first organic dye forms a first layer and said second organic dye forms a second layer on top of or underneath said first layer.

12. The composition according to claim 1, wherein said first and said second organic dyes form a multi layer structure, wherein said first organic dye is present in a first subset of layers and said second organic dye is present in a second subset of layers, which first subset of layers is the same or different or partially the same as said second subset of layers.

13. The composition according to claim 5, wherein the first organic dye comprises at least one of porphyrins and phthalocyanins, including metalloporphyrins, metallophthalocyanins, porphyrin complexes, phthalocyanin complexes, dimers/polymers as well as arrays of porphyrin or phthalocyanin molecules.

14. The composition according to claim 5, wherein said first organic dye is at least one of an octaethylporphyrin-Pd, an octaethylporphyrin-Pt, an octaethylporphyrin-Zn, or an octaethylporphyrin-Cu.

15. The composition according to claim 5, wherein said second organic dye is PF2/6.

* * * * *